(12) United States Patent
Li et al.

(10) Patent No.: US 12,058,808 B2
(45) Date of Patent: Aug. 6, 2024

(54) PRINTED CIRCUIT BOARD, COMMUNICATIONS DEVICE, AND MANUFACTURING METHOD

(71) Applicant: Huawei Technologies Co., Ltd., Shenzhen (CN)

(72) Inventors: Wenliang Li, Shenzhen (CN); Zewen Wang, Dongguan (CN); Xusheng Liu, Dongguan (CN); Ertang Xie, Dongguan (CN); Zhong Yan, Dongguan (CN); Wang Xiong, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 255 days.

(21) Appl. No.: 17/689,318

(22) Filed: Mar. 8, 2022

(65) Prior Publication Data

US 2022/0192007 A1    Jun. 16, 2022

Related U.S. Application Data

(63) Continuation of application No. PCT/CN2020/110355, filed on Aug. 20, 2020.

(30) Foreign Application Priority Data

Sep. 9, 2019    (CN) .......................... 201910864686.1

(51) Int. Cl.
*H05K 1/02* (2006.01)
*H05K 1/11* (2006.01)

(52) U.S. Cl.
CPC .......... *H05K 1/0222* (2013.01); *H05K 1/115* (2013.01); *H05K 2201/0338* (2013.01)

(58) Field of Classification Search
CPC ...... H05K 1/115; H05K 1/116; H05K 1/0245; H05K 1/0222; H05K 2201/09854; H05K 2201/0338; H01R 13/6471
See application file for complete search history.

(56) References Cited

U.S. PATENT DOCUMENTS

| 9,923,309 B1 | 3/2018 | Aizawa et al. |
| 2005/0130480 A1 | 6/2005 | Zhang |

(Continued)

FOREIGN PATENT DOCUMENTS

| CN | 204157162 U | 2/2015 |
| CN | 104718666 A | 6/2015 |

(Continued)

*Primary Examiner* — Roshn K Varghese
(74) *Attorney, Agent, or Firm* — Conley Rose, P.C.

(57) ABSTRACT

A printed circuit board includes a connector insertion area including many rows of crimping holes, each row of crimping holes includes at least two pairs of signal crimping holes (SCHs), and each pair of SCHs includes two SCHs. In a row arrangement direction of the crimping holes, at least one ground crimping hole (GCH) is arranged on either side of each pair of SCHs. A depth of the GCH is greater than or equal to a depth of the SCH, the GCH includes a main hole and a shielding component on at least one side of the main hole, a part of a side wall of the main hole is a part of a side wall of the shielding component, and a sum of lengths of the main hole and the shielding component in a first direction is greater than a length of the SCHs in the first direction.

22 Claims, 12 Drawing Sheets

(56) References Cited

U.S. PATENT DOCUMENTS

| | | |
|---|---|---|
| 2007/0230149 A1 | 10/2007 | Bibee |
| 2009/0233461 A1* | 9/2009 | Tourne .................. H05K 1/024 |
| | | 29/831 |
| 2014/0057493 A1 | 2/2014 | De Geest et al. |
| 2014/0209371 A1 | 7/2014 | Minich et al. |
| 2014/0304977 A1* | 10/2014 | Song .................... H05K 3/0047 |
| | | 29/593 |
| 2016/0150639 A1 | 5/2016 | Gailus et al. |
| 2016/0174359 A1 | 6/2016 | Coletrane et al. |
| 2016/0323995 A1* | 11/2016 | Yi ......................... H05K 1/115 |
| 2017/0187419 A1 | 6/2017 | Zhang et al. |
| 2017/0265296 A1 | 9/2017 | Charbonneau et al. |
| 2018/0070439 A1* | 3/2018 | Charbonneau ......... H05K 1/115 |

FOREIGN PATENT DOCUMENTS

| | | |
|---|---|---|
| CN | 104956776 A | 9/2015 |
| CN | 105704928 A | 6/2016 |
| CN | 107408786 A | 11/2017 |
| CN | 107535044 A | 1/2018 |
| CN | 207166845 U | 3/2018 |
| CN | 108366485 A | 8/2018 |
| CN | 109076700 A | 12/2018 |
| CN | 208708005 U | 4/2019 |
| CN | 110730558 A | 1/2020 |
| WO | 2008113767 A2 | 9/2008 |

\* cited by examiner

PRINTED CIRCUIT BOARD, COMMUNICATIONS DEVICE, AND MANUFACTURING METHOD

CROSS-REFERENCE TO RELATED APPLICATIONS

This is a continuation of International Patent Application No. PCT/CN2020/110355 filed on Aug. 20, 2020, which claims priority to Chinese Patent Application No. 201910864686.1 filed on Sep. 9, 2019. The disclosures of the aforementioned applications are hereby incorporated by reference in their entireties.

TECHNICAL FIELD

Embodiments of this application relate to the field of circuit board technologies, and in particular, to a printed circuit board and a communications device.

BACKGROUND

A printed circuit board (PCB) is an important electronic component in an electronic device, and is a carrier for electrical connections between electronic parts and components. For example, a plurality of printed circuit boards connected to each other generally need to be disposed in a communications device. In a common manner of connecting a plurality of printed circuit boards, as shown in FIG. 1, one printed circuit board is used as a backplane 10, and the remaining printed circuit boards each are used as a daughter board 30. The backplane 10 and the daughter board 30 are connected through a connector 20.

Either of the backplane 10 and the daughter board 30 is provided with signal crimping holes and ground crimping holes that are connected to the connector 20. Signal crimping pins in the connector 20 are inserted into the signal crimping holes, and ground crimping pins are inserted into the ground crimping holes. The backplane 10 and the daughter board 30 may be connected through the connector 20. A manner of arranging the signal crimping holes and the ground crimping holes on the backplane 10 or the daughter board 30 is shown in FIG. 2. Ground crimping holes 50 are on two sides of each pair of signal crimping holes 40. When a signal is transmitted between the backplane 10 and the daughter board 30 through the connector 20, an electromagnetic field between two adjacent pairs of signal crimping holes 40 is shielded by the ground crimping holes 50, to reduce signal crosstalk between the two adjacent pairs of signal crimping holes 40.

However, as a signal channel rate and density of the communications device continuously increase, the two adjacent pairs of signal crimping holes 40 keep approaching. Consequently, it is difficult to achieve an ideal electromagnetic shielding effect by using the foregoing ground crimping holes 50, and severe signal crosstalk still exists between the two adjacent pairs of signal crimping holes 40.

SUMMARY

Embodiments of this application provide a printed circuit board and a communications device, to reduce signal crosstalk between two adjacent pairs of signal crimping holes.

A first aspect of embodiments of this application provides a printed circuit board, including a connector insertion area. A plurality of rows of crimping holes are arranged in the connector insertion area, each row of crimping holes includes at least two pairs of signal crimping holes arranged at intervals, and each pair of signal crimping holes includes two signal crimping holes. In a row arrangement direction of the crimping holes, at least one ground crimping hole is arranged on either side of each pair of signal crimping holes. A depth of the ground crimping hole is greater than or equal to a depth of the signal crimping hole, the ground crimping hole includes a main hole and a shielding component on at least one side of the main hole, a part of a side wall of the main hole is a part of a side wall of the shielding component, a sum of lengths of the main hole and the shielding component in a first direction is greater than a length of the signal crimping hole in the first direction, and the first direction is a direction that is in a same plane as the row arrangement direction of the crimping holes and that is perpendicular to the row arrangement direction of the crimping holes.

In the printed circuit board provided in the first aspect of embodiments of this application, the ground crimping hole is arranged on either side of each pair of signal crimping holes, the ground crimping hole includes the main hole and the shielding component, and the part of the side wall of the main hole is the part of the side wall of the shielding component, so that an effective shielding area of the ground crimping hole includes at least the main hole and the shielding component, and the sum of the lengths of the main hole and the shielding component in the first direction is greater than the length of the signal crimping hole in the first direction. This significantly increases an effective shielding range of the ground crimping hole, compared with a related design in which a ground crimping hole includes only one main hole. Therefore, when signal crimping pins of a connector are inserted into two adjacent pairs of signal crimping holes and there is a signal, an electromagnetic field between the two adjacent pairs of signal crimping holes can be shielded by the ground crimping hole, and a shape of the electromagnetic field and line distribution of the electromagnetic field can also be changed, so that signal crosstalk between the two adjacent pairs of signal crimping holes can be reduced.

In a possible implementation, a first metal plating layer is disposed on an internal surface of the main hole. This design can enable conducting layers in the printed circuit board to be electrically connected, to improve a ground effect, and can further enhance a shielding effect by using the first metal plating layer and the shielding component that are in contact.

In a possible implementation, the shielding component includes an auxiliary hole arranged in the printed circuit board, the part of the side wall of the main hole is a first part of a side wall of the auxiliary hole, and a second metal plating layer is disposed on an internal surface of a part of the side wall of the auxiliary hole other than the first part of the side wall of the auxiliary hole.

This design can further improve a shielding effect and reduce signal crosstalk between two adjacent pairs of signal crimping holes by using the second metal plating layer.

In a possible implementation, the auxiliary hole is filled with resin or green oil. This design can ensure that a surface of the printed circuit board keeps flat, and can also enhance strength of the side wall of the auxiliary hole and improve durability of the ground crimping hole by using the resin or green oil filled into the auxiliary hole.

In a possible implementation, the auxiliary hole is a crescent-shaped hole, a circular hole, an elliptical hole, a strip-shaped hole, or a runway-shaped hole.

In a possible implementation, the shielding component includes a plurality of first metal layers and a plurality of second metal layers that are alternately stacked. The first metal layer is an area of each conducting layer that is located in the connector insertion area in the printed circuit board, and the second metal layer is formed by an area of each dielectric layer in the connector insertion area in the printed circuit board through a displacement reaction. The area of each conducting layer corresponds to the area of each dielectric layer in a thickness direction of the printed circuit board.

According to the foregoing design, the shielding component includes a part of the printed circuit board, in other words, the shielding component and the printed circuit board are in an integrated structure, so that overall strength of the printed circuit board can be ensured.

In a possible implementation, the ground crimping hole includes two shielding components, and the two shielding components are on two sides of the main hole in the first direction.

In a possible implementation, the ground crimping hole includes at least three shielding components, and the at least three shielding components are arranged at equal intervals around the main hole.

In a possible implementation, a main hole plate is disposed on the periphery of the main hole, and an auxiliary hole plate is disposed on the periphery of the shielding component. This design can increase a ground area of the printed circuit board and improve a ground effect of the printed circuit board by using the main hole plate and the auxiliary hole plate.

In a possible implementation, in two adjacent rows of crimping holes, in the first direction, any pair of signal crimping holes in a current row and any pair of signal crimping holes in a next row are staggered, and a ground crimping hole in the current row and a ground crimping hole in the next row are staggered.

The foregoing design can increase a distance between two adjacent up-down rows of signal crimping holes, to reduce signal crosstalk between two adjacent up-down pairs of signal crimping holes in the two adjacent rows, and can further change a shape and distribution of an electromagnetic field between the two adjacent up-down pairs of signal crimping holes in the two adjacent rows, to reduce signal crosstalk between the two adjacent up-down pairs of signal crimping holes in the two adjacent rows.

A second aspect of embodiments of this application provides another printed circuit board, including a connector insertion area. A plurality of rows of crimping holes are arranged in the connector insertion area, each row of crimping holes includes at least two pairs of signal crimping holes arranged at intervals, and each pair of signal crimping holes includes two signal crimping holes. In a row arrangement direction of the crimping holes, at least one ground crimping hole is arranged on either side of each pair of signal crimping holes. A depth of the ground crimping hole is greater than or equal to a depth of the signal crimping hole, the ground crimping hole includes a main part and an auxiliary part connected to the main part, a third metal plating layer is disposed on an internal surface of the auxiliary part, a sum of lengths of the main part and the auxiliary part in a first direction is greater than a length of the signal crimping hole in the first direction, and the first direction is a direction that is in a same plane as the row arrangement direction of the crimping holes and that is perpendicular to the row arrangement direction of the crimping holes.

In the printed circuit board provided in the second aspect of embodiments of this application, the ground crimping hole is arranged on either side of each pair of signal crimping holes, the ground crimping hole includes the main part and the auxiliary part connected to the main part, and the third metal plating layer is disposed on the internal surface of the auxiliary part, so that an effective shielding area of the ground crimping hole includes at least the main part and the third metal plating layer, and the sum of the lengths of the main part and the auxiliary part in the first direction is greater than the length of the signal crimping hole in the first direction. This significantly increases an effective shielding range of the ground crimping hole, compared with a related design in which a ground crimping hole includes only one main hole. Therefore, when signal crimping pins of a connector are inserted into two adjacent pairs of signal crimping holes and there is a signal, an electromagnetic field between the two adjacent pairs of signal crimping holes can be shielded by the foregoing ground crimping hole, and a shape of the electromagnetic field and line distribution of the electromagnetic field can also be changed, so that signal crosstalk between the two adjacent pairs of signal crimping holes can be reduced.

In a possible implementation, a fourth metal plating layer is disposed on an internal surface of the main part, and the fourth metal plating layer is connected to the third metal plating layer. This design can improve an effect of shielding a signal between the two adjacent pairs of signal crimping holes by the main part, and can further improve a ground effect by connecting conducting layers in the printed circuit board.

In a possible implementation, a cross section of the ground crimping hole is peanut-shaped or dumbbell-shaped by using a surface parallel to the printed circuit board as a cross section.

In a possible implementation, a hole plate is disposed on the periphery of the ground crimping hole. This design can increase a ground area of the printed circuit board and improve a ground effect of the printed circuit board by using the hole plate disposed on the periphery of the ground crimping hole.

A third aspect of embodiments of this application provides a communications device, including the printed circuit board provided in the foregoing embodiments and a connector that fits with the printed circuit board. A signal crimping pin in the connector is inserted into a signal crimping hole of the printed circuit board, and a ground crimping pin in the connector is inserted into a ground crimping hole.

The communications device includes the printed circuit board according to the first aspect and the second aspect. Therefore, the communications device also has advantages of the printed circuit board. Details are not described herein again.

BRIEF DESCRIPTION OF DRAWINGS

To describe technical solutions in some embodiments of this application more clearly, the following briefly describes the accompanying drawings for describing embodiments. It is clear that the accompanying drawings in the following descriptions show some embodiments of this application, and persons of ordinary skill in the art may still derive other drawings from these accompanying drawings without creative efforts.

DESCRIPTION OF REFERENCE NUMERALS

1: printed circuit board; 2: connector insertion area; 11: conducting layer; 12: dielectric layer; 10: backplane; 20: connector; 30: daughter board; 40: signal crimping hole; 50: ground crimping hole; 50a: shielding component; 51: main hole; 52: first metal plating layer; 53: main hole plate; 54: auxiliary hole; 54a: first part; 55: second metal plating layer; 56: auxiliary hole plate; 61: main body; 62: fourth metal plating layer; 63: main body hole plate; 64: auxiliary part; 65: third metal plating layer; 66: auxiliary hole plate; 61a: first side wall; 64a: second side wall.

DESCRIPTION OF EMBODIMENTS

To make the foregoing objectives, features, and advantages of embodiments of this application clearer, the following clearly and describes the technical solutions of embodiments of this application with reference to the accompanying drawings in embodiments of this application.

It is clear that the described embodiments are merely some but not all the embodiments of this application. All other embodiments obtained by persons of ordinary skill in the art according to embodiments of this application without creative efforts shall fall within the protection scope of this application.

Figure 1:
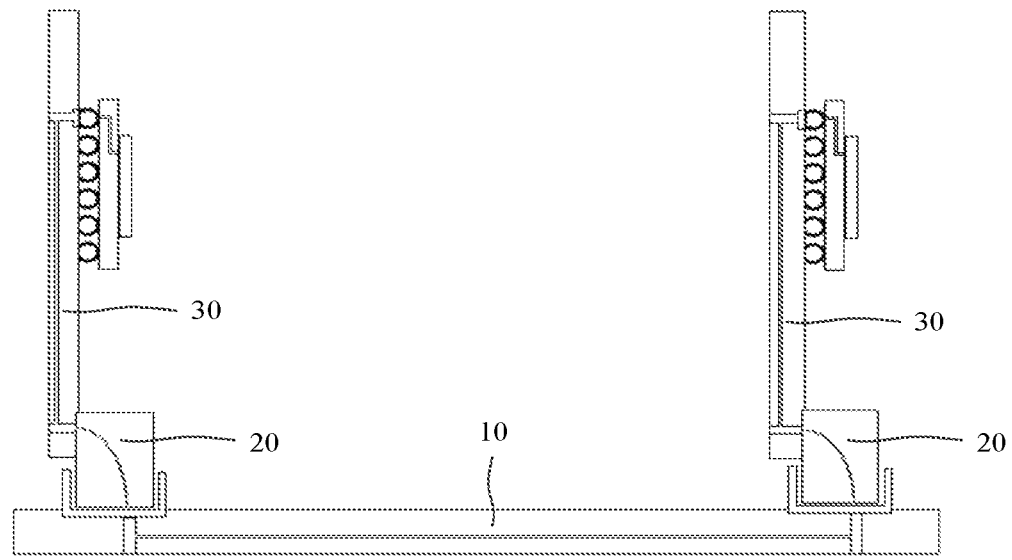
FIG. 1 is a schematic diagram of connecting a plurality of printed circuit boards in a related design.
Figure 2:
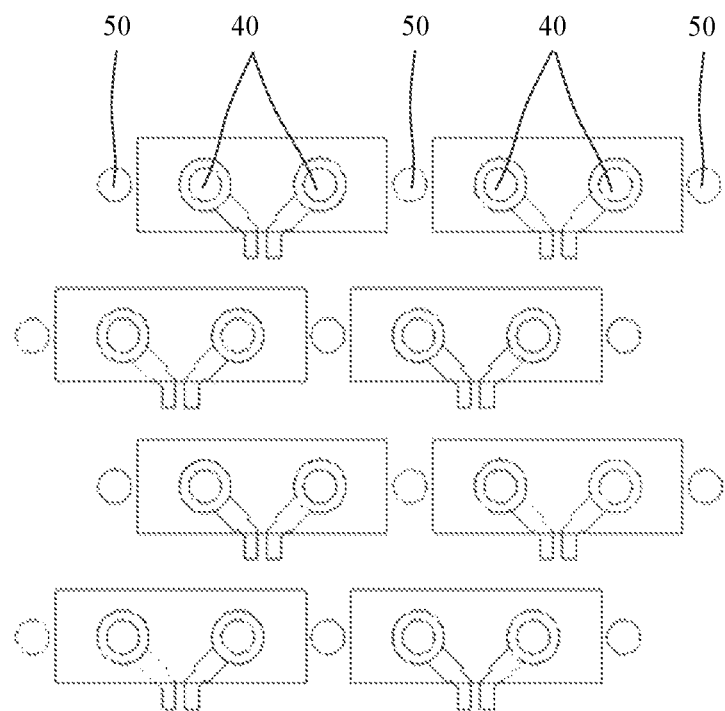
FIG. 2 is a schematic diagram of structures of a signal crimping hole and a ground crimping hole in a related design.
Figure 3:
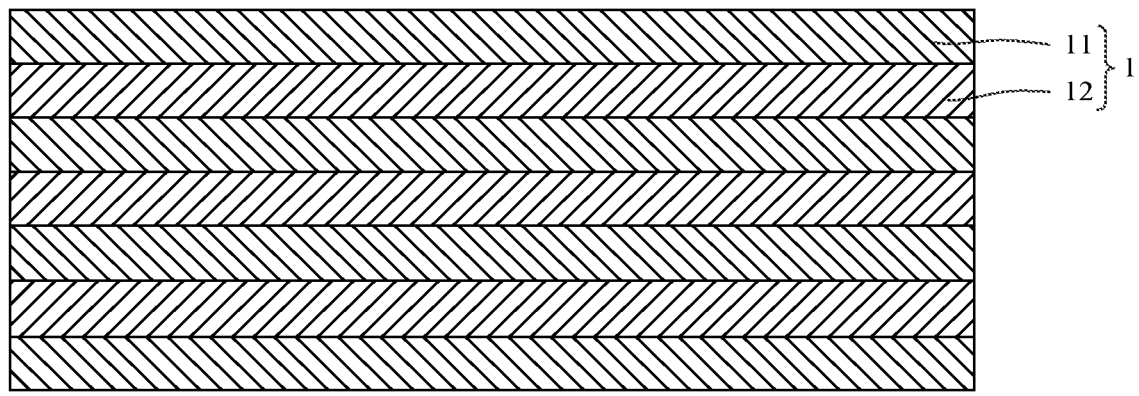
FIG. 3 is a section view of a printed circuit board according to an embodiment of this application.

A printed circuit board provided in embodiments of this application may be a single-layer board, or may be a multi-layer board. For example, as shown in FIG. 3, a printed circuit board 1 is a multi-layer board, and includes a plurality of conducting layers 11 and a plurality of dielectric layers 12, and the plurality of conducting layers 11 and the plurality of dielectric layers 12 are alternately stacked. The conducting layer 11 is generally made of copper foil, and is used to form a line in the printed circuit board. The dielectric layer 12 is generally made of resin, glass fiber, or the like, and is used to electrically isolate two adjacent conducting layers 11.

Figure 4:
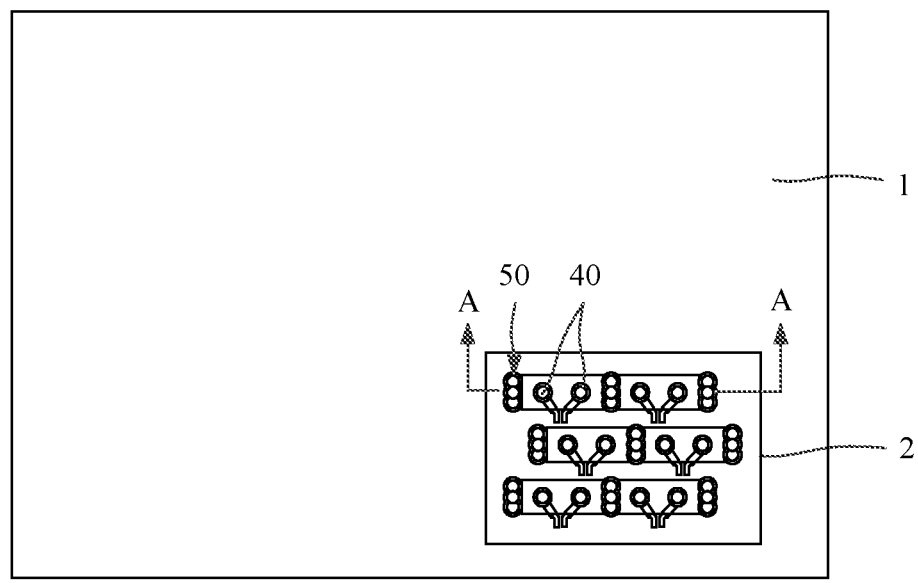
FIG. 4 is a front view of a printed circuit board according to an embodiment of this application.

To implement a connection between printed circuit boards, as shown in FIG. 4, a connector insertion area 2 is generally disposed on the printed circuit board 1, and a location of the connector insertion area 2 in the printed circuit board 1 is not limited. For example, the connector insertion area 2 may be in a four-corner area of the printed circuit board 1, or may be in a center area. A plurality of rows of crimping holes are arranged in the connector insertion area 2, each row of crimping holes includes at least two pairs of signal crimping holes 40 arranged at intervals, and each pair of signal crimping holes 40 includes two signal crimping holes 40. For example, in an embodiment shown in FIG. 4, three rows of crimping holes are arranged in the connector insertion area 2, each row of crimping holes includes two pairs of signal crimping holes 40, and each pair of signal crimping holes may be used to transmit a differential signal.

In a same row of crimping holes, at least one ground crimping hole 50 is arranged on either side of each pair of signal crimping holes 40. Alternatively, in a same row of crimping holes, a ground crimping hole 50 is arranged between any two adjacent pairs of signal crimping holes 40, so that the two adjacent pairs of signal crimping holes 40 are separated by the ground crimping hole 50. The ground crimping hole 50 matches a ground crimping pin of a connector, so that the ground crimping pin in the connector is inserted into the ground crimping hole 50. In addition, an electromagnetic field between the two pairs of signal crimping holes 40 on two sides of the ground crimping hole 50 may be shielded by the ground crimping hole 50, to reduce signal crosstalk between the two adjacent pairs of signal crimping holes 40.

Figure 5:
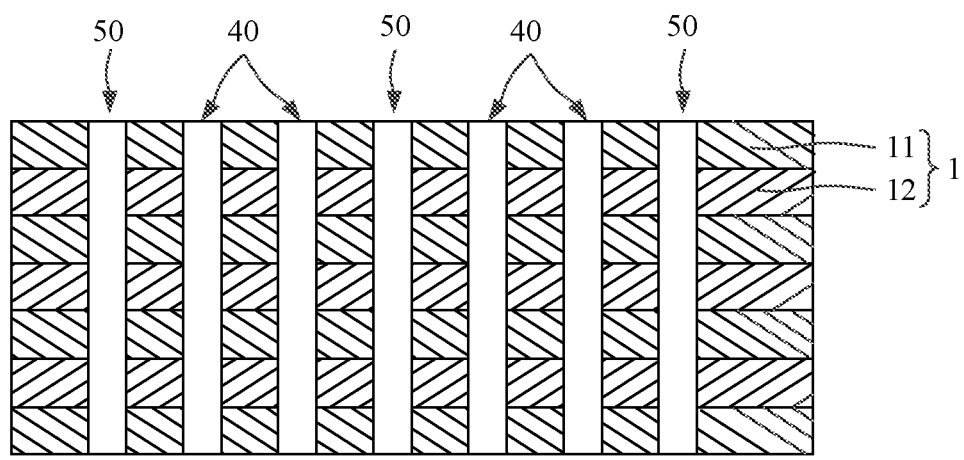
FIG. 5 is a section view of an A-A direction in FIG. 4.

It should be noted that the signal crimping hole 40 may penetrate the printed circuit board 1 in a thickness direction of the printed circuit board 1, in other words, the signal crimping hole 40 is a through-hole, and a depth of the signal crimping hole 40 is the same as a thickness of the printed circuit board 1. However, no limitation is imposed thereto. Alternatively, the signal crimping hole 40 may not penetrate the printed circuit board 1 in a thickness direction of the printed circuit board 1, in other words, the signal crimping hole 40 is a blind hole, and a depth of the signal crimping hole 40 is less than a thickness of the printed circuit board 1. Similarly, the ground crimping hole 50 may penetrate the printed circuit board 1 in the thickness direction of the printed circuit board 1, or may not penetrate the printed circuit board 1, and it only needs to ensure that a depth of the ground crimping hole 50 is greater than or equal to the depth of the signal crimping hole 40, to shield the electromagnetic field between the two adjacent pairs of signal crimping holes 40. For example, as shown in FIG. 5, in the thickness direction of the printed circuit board 1, both the signal crimping hole 40 and the ground crimping hole 50 penetrate the printed circuit board 1, in other words, both the depth of the ground crimping hole 50 and the depth of the signal crimping hole 40 are equal to the thickness of the printed circuit board 1.

To reduce the signal crosstalk between the two adjacent pairs of signal crimping holes 40, there are a plurality of forms of ground crimping holes 50. The following provides descriptions by using an example with reference to the accompanying drawings of this specification.

Embodiment 1

Figure 6:
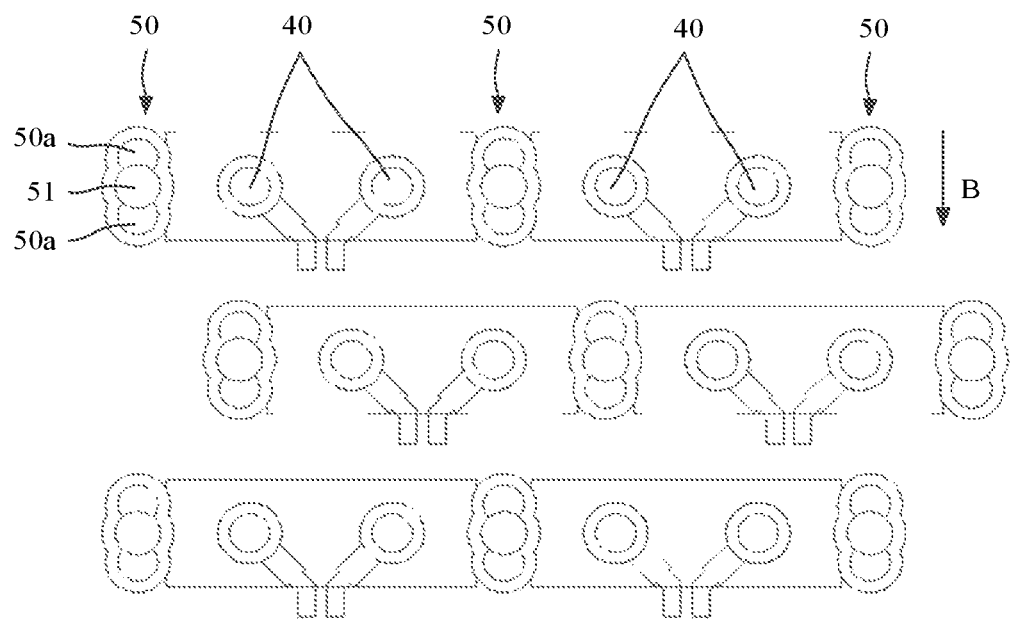
FIG. 6 is a diagram of arranging signal crimping holes and ground crimping holes in a connector insertion area according to Embodiment 1 of this application.
Figure 7:
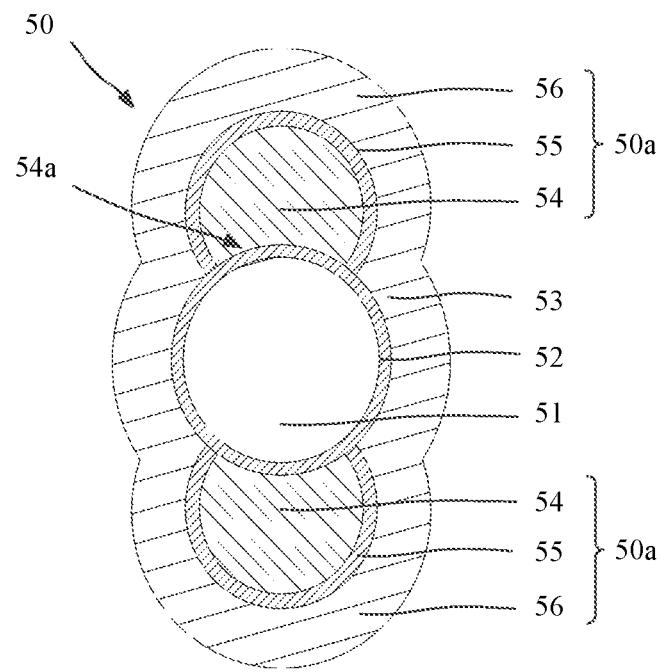
FIG. 7 is a section view of a ground crimping hole in FIG. 6.

FIG. 6 is a diagram of arranging signal crimping holes and ground crimping holes in a connector insertion area according to Embodiment 1 of this application. FIG. 7 is a section view of a ground crimping hole in FIG. 6. In this embodiment, a plurality of rows of crimping holes are arranged in the connector insertion area 2, each row of crimping holes includes at least two pairs of signal crimping holes 40 arranged at intervals, and each pair of signal crimping holes 40 includes two signal crimping holes. In a same row of crimping holes, at least one ground crimping hole 50 is arranged on either side of each pair of signal crimping holes 40. The ground crimping hole 50 includes a main hole 51 and at least one shielding component, a part of a side wall of the main hole 51 is a part of a side wall of the shielding component 50*a*, a sum of lengths of the main hole 51 and the shielding component 50*a* in a first direction is greater than a length of the signal crimping hole 40 in the first direction, and the first direction is a direction that is in a same plane as a row arrangement direction of the crimping holes and that is perpendicular to the row arrangement direction of the crimping holes. For example, in the embodiment shown in FIG. 6, the row arrangement direction of the crimping holes is a transverse direction in FIG. 6, and the first direction B is a longitudinal direction in FIG. 6. In addition, the first direction B and the row arrangement direction of the crimping holes are in the same plane.

In this embodiment, the main hole 51 may penetrate the printed circuit board 1 in the thickness direction of the printed circuit board 1, or may not penetrate the printed circuit board 1, and it only needs to ensure that a depth of the main hole 51 is greater than or equal to the depth of the signal crimping hole 40. A shape of the main hole 51 is the same as or similar to a shape of a ground crimping pin in a connector. For example, the shape of the ground crimping pin is generally circular, elliptical, or oblate. Correspondingly, the main hole 51 may be a circular hole, an elliptical hole, or an oblate hole. In this embodiment, the main hole 51 is a circular hole. A design of a circular main hole implements simple manufacturing, low costs, and high precision of limiting a location of the ground crimping pin. The main hole 51 is used to fit with the ground crimping pin in the connector. In addition, when the ground crimping pin in the connector is inserted into the main hole 51, a part of a side surface of the ground crimping pin is in close contact with a part of a side surface of the shielding part 50*a*, so that there is no gap between the ground crimping pin and the shielding part, to prevent a signal between the main hole 51 and the shielding component 50*a*.

In a possible implementation, as shown in FIG. 7, a first metal plating layer 52 is disposed on an internal surface of the main hole 51, and the first metal plating layer 52 may be formed through electroplating, evaporation deposition, sputtering, chemical plating, or vapor deposition. In this embodiment, the first metal plating layer is formed through electroplating. The first metal plating layer 52 may be made of a metal material such as copper, aluminum, or silver or another alloy material. In this embodiment, the first metal plating layer 52 is a copper plating layer. The first metal plating layer 52 is disposed on the internal surface of the main hole 51, so that all conducting layers in the printed circuit board 1 can be electrically connected. After the ground crimping pin in the connector is inserted into the main hole 51, the side surface of the ground crimping pin may be simultaneously in contact with all the conducting layers, to improve a ground effect. In addition, an area that is of the first metal plating layer 52 and that corresponds to the shielding component 50*a* is attached to the shielding component 50*a*, so that there is no gap between the first metal plating layer 52 and the shielding component 50*a*, to prevent a signal between the first metal plating layer 52 and the shielding component 50*a*.

The shielding component 50*a* is on the periphery of the main hole 51, and may be on one side, two sides, or around the main hole 51, or the shielding component 50*a* is disposed on one side, two sides, or around the main hole 51. For example, in the embodiment shown in FIG. 7, one shielding component 50*a* is disposed on either of upper and lower sides of the main hole 51 in the first direction. The shielding component 50*a* includes but is not limited to the following several possible structure forms.

In a possible structure form, as shown in FIG. 7, the shielding component 50*a* includes two auxiliary holes 54 on the upper and lower sides of the main hole 51. The two auxiliary holes 54 may be through-holes penetrating the printed circuit board 1, or may be blind holes penetrating a part of the thickness of the printed circuit board 1. A part of a side wall of the auxiliary hole 54 overlaps a part of the side wall of the main hole 51 between the auxiliary hole 54 and the main hole 51, or the auxiliary hole 54 and the main hole 51 share a part of a side wall between the auxiliary hole 54 and the main hole 51, or a part of the side wall of the main hole 51 is a first part 54*a* of a side wall of the auxiliary hole 54, so that there is no gap between the main hole 51 and the auxiliary hole 54, to prevent a signal between the main hole 51 and the auxiliary hole 54.

A second metal plating layer 55 is disposed on an internal surface of the auxiliary hole 54. The second metal plating layer 55 is on the internal surface of the auxiliary hole 54 other than the first part 54*a*, in other words, the second metal plating layer 55 is a semi-closed structure having an opening on a side facing the main hole 51. Two ends of the opening of the second metal plating layer 55 are separately in contact with the first metal plating layer 52, so that the second metal plating layer 55 and a part of the first metal plating layer 52 at the two ends of the opening of the second metal plating layer 55 form a closed ring. In other words, the main hole 51 is a complete hole, and the auxiliary hole 54 is a non-complete hole. In this specification, a side wall of the main hole 51 that is a complete hole can form a closed ring, and a side wall of the auxiliary hole 54 that is a non-complete hole cannot form a closed ring and has a gap or an opening. For example, as shown in FIG. 7, a closed circular hole is formed by the side wall of the main hole 51, a semi-closed crescent-shaped hole is formed by the side wall of the auxiliary hole 54, and a side that is of the auxiliary hole 54 and that faces the main hole 51 has an opening. In this way, there is no gap between the first metal plating layer 52 and the second metal plating layer 55, to prevent a signal between the first metal plating layer 52 and the second metal plating layer 55, and reduce signal crosstalk between two adjacent pairs of signal crimping holes 40.

The auxiliary hole 54 may be a crescent-shaped hole, a circular hole, an elliptical hole, a strip-shaped hole, or a runway-shaped hole. In the embodiment shown in FIG. 7, the auxiliary hole 54 is a crescent-shaped hole. In a possible implementation, the auxiliary hole 54 is filled with resin or green oil. This design can ensure that a surface of the printed circuit board 1 keeps flat, and can also enhance strength of the side wall of the auxiliary hole 54 and improve durability of the ground crimping hole 50 by using the resin or green oil filled into the auxiliary hole 54.

A main hole plate 53 is disposed on the periphery of the main hole 51, and an auxiliary hole plate 56 is disposed on the periphery of the auxiliary hole 54. The main hole plate 53 and the auxiliary hole plate 56 may be of an integrated structure. Similar to a soldering pad in the printed circuit board 1, the main hole plate 53 is a conducting area around the main hole 51, and an area of the main hole plate 53 is greater than a cross-sectional area of the main hole 51, so that a ground area of the main hole 51 can be increased. Likewise, similar to a soldering pad in the printed circuit board 1, the auxiliary hole plate 56 is a conducting area around the auxiliary hole 54, and an area of the auxiliary hole plate 56 is greater than a cross-sectional area of the auxiliary hole 54, so that a ground area of the auxiliary hole 54 can be increased. The main hole plate 53 and the auxiliary hole plate 56 are respectively disposed around the main hole 51 and the auxiliary hole 54, to increase the ground area of the main hole 51 and the ground area of the auxiliary hole 54, and improve a ground effect of the ground crimping hole 50.

Figure 8:
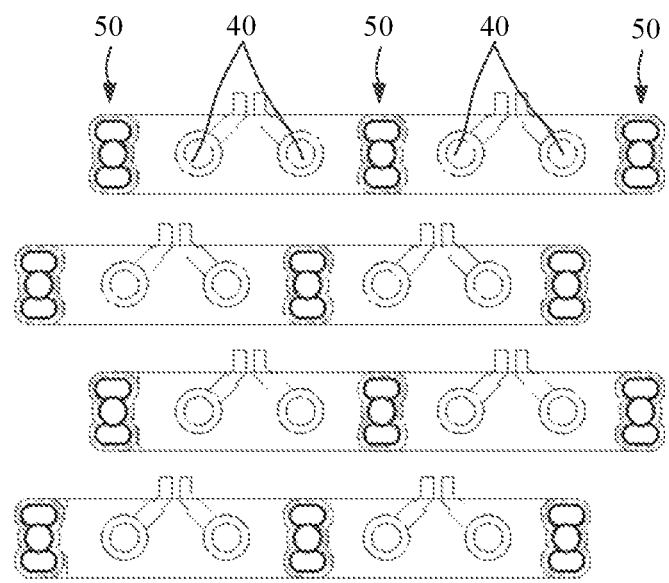
FIG. 8 is another diagram of arranging signal crimping holes and ground crimping holes in a connector insertion area according to Embodiment 1 of this application.
Figure 9:
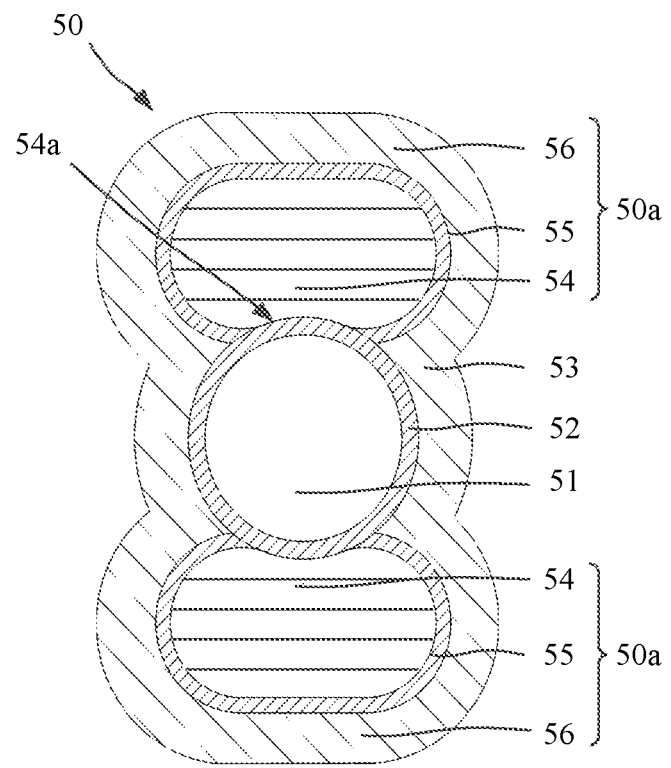
FIG. 9 is a section view of a ground crimping hole in FIG. 8.

It may be understood that a form of the ground crimping hole 50 is not limited to the structure form described in the foregoing embodiment, and another structure form may be used. For example, as shown in FIG. 8 and FIG. 9, the ground crimping hole 50 includes the main hole 51 and the auxiliary hole 54 on either side of the main hole 51. The main hole 51 is a circular hole. The part of the side wall of the main hole 51 is formed by the part of the side wall of the auxiliary hole 54, in other words, the part of the side wall of the main hole 51 is the part of the side wall of the auxiliary hole 54. The first metal plating layer 52 is disposed on the internal surface of the main hole 51, the auxiliary hole 54 is a runway-shaped hole, the second metal plating layer 55 is disposed on the internal surface of the auxiliary hole 54, and the auxiliary hole 54 is filled with resin or green oil, to ensure that the surface of the printed circuit board 1 keeps flat, and can also enhance strength of the side wall of the auxiliary hole 54 and improve durability of the ground crimping hole 50.

Figure 10:
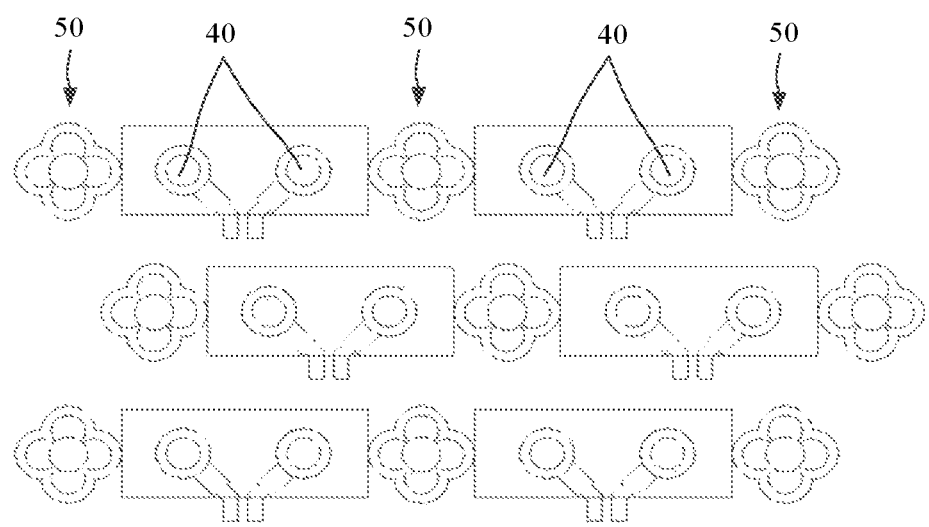
FIG. 10 is another diagram of arranging signal crimping holes and ground crimping holes in a connector insertion area according to Embodiment 1 of this application.

In addition, the auxiliary hole 54 is not limited to being distributed on either side of the main hole 51. Alternatively, the auxiliary hole 54 may be distributed on one side of the main hole 51 or around the main hole 51. For example, as shown in FIG. 10, a quantity of auxiliary holes 54 is greater than or equal to 3. These auxiliary holes 54 are arranged around the main hole 51 at equal intervals.

In another possible structure form, the shielding component 50a includes a plurality of first metal layers and a plurality of second metal layers that are alternately stacked. The first metal layer is an area of each conducting layer 11 that is located in the connector insertion area 2 in the printed circuit board 1, and the second metal layer is formed by an area of each dielectric layer 12 in the connector insertion area 2 in the printed circuit board 1 through a displacement reaction. The area of each conducting layer 11 corresponds to the area of each dielectric layer 12 in a thickness direction of the printed circuit board 1. The shielding component 50a may be manufactured in the following manner.

Before the shielding component 50a alternately laminates the conducting layers 11 and the dielectric layers 12 to form the printed circuit board 1, metal oxidation replacement processing may be performed on some dielectric layers 12 in the connector insertion area 2, so that some dielectric layers 12 in the connector insertion area 2 are of a conducting structure, in other words, the second metal layers are formed. Then, the dielectric layers 12 and the conducting layers 11 having the second metal layers are alternately stacked to form the printed circuit board 1.

Embodiment 2

Figure 11:
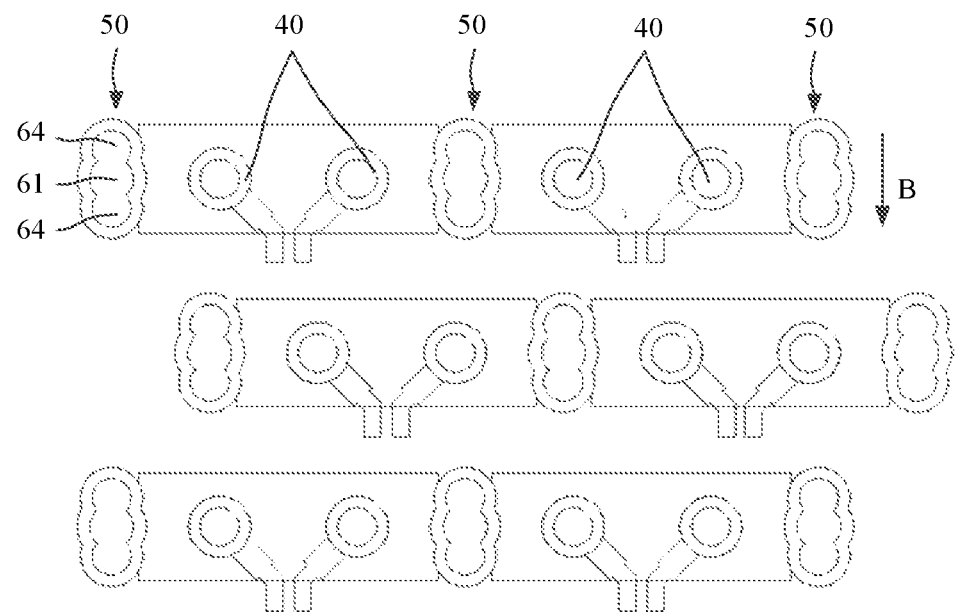
FIG. 11 is a diagram of arranging signal crimping holes and ground crimping holes in a connector insertion area according to Embodiment 2 of this application.
Figure 12:
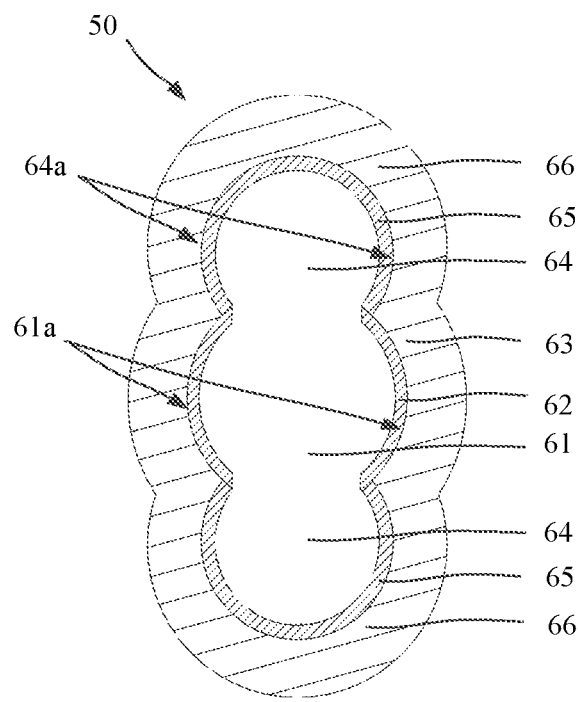
FIG. 12 is a section view of a ground crimping hole in FIG. 11.

Embodiment 2 of this application provides a printed circuit board 1. As shown in FIG. 11 and FIG. 12, the printed circuit board 1 also includes a connector insertion area 2. A plurality of rows of crimping holes are arranged in the connector insertion area 2, each row of crimping holes includes at least two pairs of signal crimping holes 40 arranged at intervals, and each pair of signal crimping holes 40 includes two signal crimping holes 40. In a row arrangement direction of the crimping holes, at least one ground crimping hole 50 is arranged on either side of each pair of signal crimping holes 40. A depth of the ground crimping hole 50 is greater than or equal to a depth of the signal crimping hole 40.

A difference between Embodiment 2 and Embodiment 1 is as follows. The ground crimping hole 50 includes a main body 61 and an auxiliary part 64 connected to the main body 61, a third metal plating layer 65 is disposed on an internal surface of the auxiliary part 64, a sum of lengths of the main part 61 and the auxiliary part 64 in a first direction B is greater than a length of the signal crimping hole 40 in the first direction, and the first direction B is a direction that is in a same plane as the row arrangement direction of the crimping holes and that is perpendicular to the row arrangement direction of the crimping holes.

In this embodiment, the ground crimping hole 50 includes two parts: the main body 61 and the auxiliary part 64. A side wall of the main body 61 is connected to a side wall of the auxiliary part 64, so that the ground crimping hole 50 is jointly formed by the side wall of the main body 61 and the side wall of the auxiliary part 64. For example, as shown in FIG. 12, the main body 61 includes two first side walls 61a, and the two first side walls 61a are disposed oppositely, to fit with a ground crimping pin in the connector and limit a location of the ground crimping pin. The auxiliary part 64 includes one second side wall 64a. A semi-circular structure is formed by the second side wall 64a. Two ends of the second side wall 64a are respectively connected to ends of the two first side walls 61a. The two second side walls 64a on two sides of the main body 61 and the two first side walls 61a of the main body 61 jointly form a long-strip-shaped hole. A length of the long-strip-shaped hole in the first direction B is greater than the length of the signal crimping hole 40 in the first direction.

A third metal plating layer 65 is disposed on an internal surface of the second side wall 64a, in other words, on the internal surface of the auxiliary part 64, and the third metal plating layer 65 may be formed through electroplating, evaporation deposition, sputtering, chemical plating, or vapor deposition. In this embodiment, the third metal plating layer is formed through electroplating. The third metal plating layer 65 may be made of a metal material such as copper, aluminum, or silver or another alloy material. In this embodiment, the third metal plating layer 65 is a copper plating layer. When the ground crimping pin in the connector is inserted into the main body 61, a part of a side surface of the ground crimping pin may be in contact with the third metal plating layer 65, and the ground crimping pin and the third metal plating layer 65 jointly form a barrier for isolating an electromagnetic field on two sides of the ground crimping hole 50, to reduce signal crosstalk between two adjacent pairs of signal crimping holes 40

In the printed circuit board provided in Embodiment 2 of this application, the ground crimping hole 50 is arranged on either side of each pair of signal crimping holes 40, the ground crimping hole 50 includes the main part 61 and the auxiliary part 64 connected to the main part 61, and the third metal plating layer 65 is disposed on the internal surface of the auxiliary part 64, so that an effective shielding area of the ground crimping hole 50 includes at least the main part 61 and the third metal plating layer 65, and the sum of the lengths of the main part 61 and the auxiliary part 64 in the first direction is greater than the length of the signal crimping hole 40 in the first direction. This significantly increases an effective shielding range of the ground crimping hole 50, compared with a related design in which a ground crimping hole includes only one main hole. Therefore, when the signal crimping pins of the connector are inserted into two adjacent pairs of signal crimping holes 40 and there is a signal, an electromagnetic field between the two adjacent pairs of signal crimping holes 40 can be shielded by the foregoing ground crimping hole 50, and a shape of the electromagnetic field and line distribution of the electromagnetic field between the two adjacent pairs of signal crimping holes 40 can also be changed, so that signal crosstalk between the two adjacent pairs of signal crimping holes 40 can be reduced.

In the foregoing embodiment, disposing the third metal plating layer 65 on the internal surface of the auxiliary part 64 may not only improve an effect of shielding the electromagnetic field between the two adjacent pairs of signal crimping holes 40, but also improve a ground effect of each conducting layer in the printed circuit board 1.

A metal plating layer may be disposed on an internal surface of the main body 61, or no metal plating layer may be disposed. In an optional implementation, a fourth metal plating layer 62 is disposed on the internal surface of the main body 61, in other words, on an internal surface of the first side wall 61a, and the fourth metal plating layer 62 is connected to the third metal plating layer 65. The fourth metal plating layer 62 may be formed through electroplating, evaporation deposition, sputtering, chemical plating, or vapor deposition. In this embodiment, the fourth metal plating layer is formed through electroplating. The fourth metal plating layer 62 may be made of a metal material such as copper, aluminum, or silver or another alloy material. In this embodiment, the fourth metal plating layer 62 is a copper plating layer.

Figure 13:
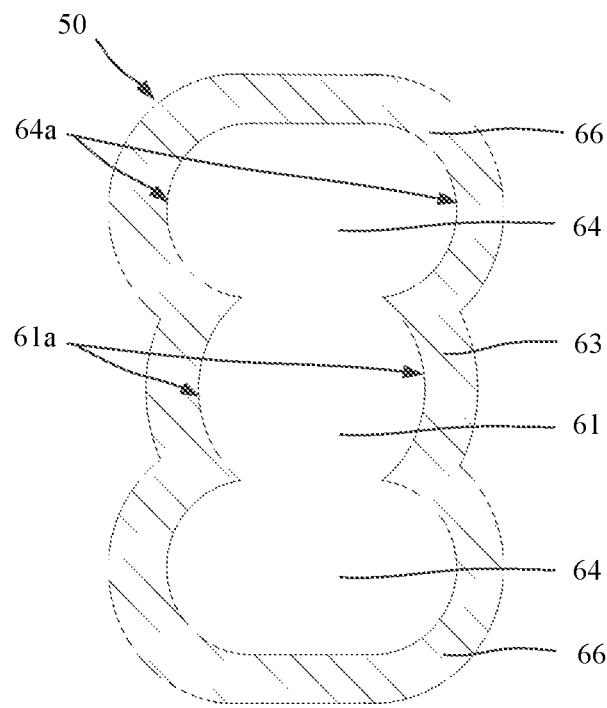
FIG. 13 is a section view of another ground crimping hole according to Embodiment 2 of this application.
Figure 14:
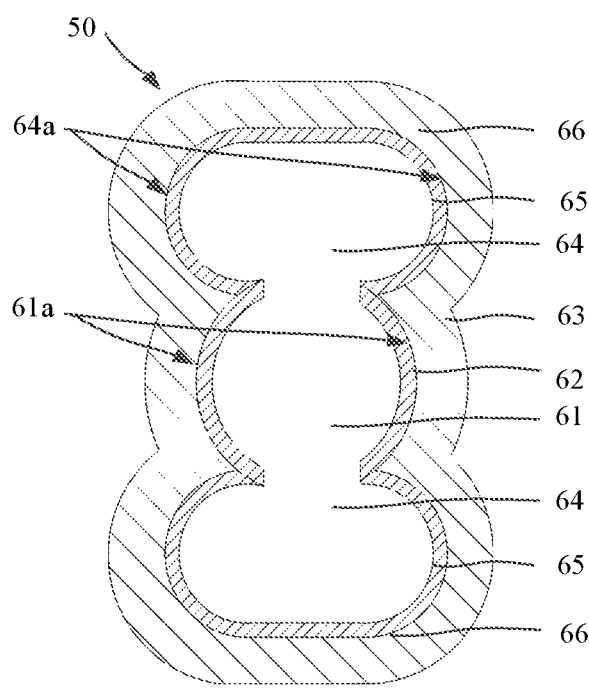
FIG. 14 is a section view of disposing a metal plating layer in the ground crimping hole in FIG. 13.

In the embodiment shown in FIG. 12, a cross section of the ground crimping hole 50 is peanut-shaped by using a surface parallel to the printed circuit board 1 as a cross section. However, no limitation is imposed thereto. As shown in FIG. 13 and FIG. 14, the cross section of the ground crimping hole 50 may alternatively be dumbbell-shaped.

A main body hole plate 63 is disposed on the periphery of the main body 61, and an auxiliary part hole plate 66 is disposed on the periphery of the auxiliary part 64. The main body hole plate 63 and the auxiliary part hole plate 66 may be of an integrated structure, in other words, a hole plate is disposed on the periphery of the ground crimping hole 50. Similar to a soldering pad in the printed circuit board 1, the main part hole plate 63 is a conducting area around the main part 61, and an area of the main part hole plate 63 is greater than a cross-sectional area of the main part 61, so that a ground area of the main part 61 can be increased. Likewise, similar to a soldering pad in the printed circuit board 1, the auxiliary part hole plate 66 is a conducting area around the auxiliary part 64, and an area of the auxiliary part hole plate 66 is greater than a cross-sectional area of the auxiliary part 64, so that a ground area of the auxiliary part 64 can be increased. The main part hole plate 63 and the auxiliary part hole plate 66 are respectively disposed around the main part 61 and the auxiliary part 64, to increase the ground area of the main part 61 and the ground area of the auxiliary part 64, and improve a ground effect of the ground crimping hole 50.

In Embodiment 1, when the ground crimping hole 50 is designed as shown in FIG. 7, the ground crimping hole 50 may be manufactured by using the following preparation method.

Step 1: Etch each conducting layer in the connector insertion area 2 in the printed circuit board to form a main hole plate and an auxiliary hole plate.

Further, before the printed circuit board 1 is manufactured, each conducting layer that forms the printed circuit board may be etched to form a main hole plate 53 and an auxiliary hole plate 56 in an area at each conducting layer that corresponds to the connector insertion area 2. The main hole plate 53 and the auxiliary hole plate 56 may be formed in one etching process, or may be formed respectively in two etching processes. Then, the conducting layers and dielectric layers having the main hole plate 53 and the auxiliary hole plate 56 are alternately laminated to form the printed circuit board 1 having the main hole plate 53 and the auxiliary hole plate 56.

Step 2: Drill the two auxiliary holes 54 in the printed circuit board having the main hole plate 53 and the auxiliary hole plate 56 with a drill bit. For example, the two auxiliary holes 54 are drilled with a drill bit of 16 mil at a spacing of 24 mil. The auxiliary hole plate 56 is disposed on the periphery of the auxiliary hole 54. Alternatively, drilling is performed in an area of the auxiliary hole plate 56 with a drill bit, to form the two auxiliary holes 54 in the auxiliary hole plate 56.

Step 3: Perform copper plating on an internal surface of the auxiliary hole 54, to form the second metal plating layer 55, where an annular through-hole is formed by the second metal plating layer 55 in the auxiliary hole 54.

Further, the second metal plating layer 55 may be formed on the internal surface of the auxiliary hole 54 through evaporation deposition, sputtering, electroplating, chemical plating, or vapor deposition, and the second metal plating layer 55 covers the internal surface of the auxiliary hole 54.

Step 4: Fill the annular through-hole formed by the second metal plating layer 55 with resin or green oil.

Filling the annular through-hole formed by the second metal plating layer with resin or green oil can ensure that a surface of the printed circuit board keeps flat, and can also help subsequently form a main hole 51 and form a first metal plating layer 52 in the main hole 51.

Step 5: Perform drilling in the center of the two auxiliary holes 54 to form the main hole 51. Further, the main hole 51 is formed by performing drilling at a symmetrical center of the two auxiliary holes 54, for example, by performing drilling with a drill bit of 18 mil. A center of the main hole 51 is the symmetrical center of the two auxiliary holes 54.

Side walls on upper and lower sides of the main hole 51 are formed in the two auxiliary holes 54, in other words, the side walls of the upper and lower sides of the main hole 51 are respectively parts of side walls of the auxiliary holes 54 on the upper and lower sides of the main hole 51.

Step 6: Perform copper plating in the main hole 51 to form the first metal plating layer 52. Further, the first metal plating layer 52 may be formed on the internal surface of the main hole 51 through evaporation deposition, sputtering, electroplating, chemical plating, or vapor deposition, and the first metal plating layer 52 covers the internal surface of the main hole 51. In addition, a through-hole into which the ground crimping pin of the connector is inserted is formed by the first metal plating layer in the main hole 51.

According to the foregoing preparation method, the main hole 51 and the two auxiliary holes 54 may be formed through several times (for example, three times) of drilling. In a case in which an area of the connector insertion area 2 in the printed circuit board 1 is relatively small, reducing a quantity of times of drilling can reduce process difficulty, and can reduce influence on overall strength of the printed circuit board 1, so that the printed circuit board 1 has better strength.

It may be understood that, in the embodiment shown in FIG. 7, the drill bit may be replaced with a milling cutter, and the main hole 51 and the auxiliary holes 54 may be machined in the printed circuit board by using the milling cutter. In addition, in the foregoing process of manufacturing the ground crimping hole 50, the second metal plating layer may not be formed in the auxiliary hole 54 first. Instead, film coating may be performed in the main hole 51 and the auxiliary hole 54 to obtain the first metal plating layer and the second metal plating layer once after the auxiliary hole 54 and the main hole 51 are formed. The structure of the ground crimping hole 50 shown in FIG. 12 may be manufactured in this manner.

In Embodiment 1, when the ground crimping hole 50 is designed as shown in FIG. 9, the ground crimping hole 50 may be manufactured by using the following preparation method.

Step 1: Etch each conducting layer in the connector insertion area in the printed circuit board to form a main hole plate and an auxiliary hole plate.

Further, before the printed circuit board 1 is manufactured, each conducting layer 11 that forms the printed circuit board 1 may be etched to form a main hole plate 53 and an auxiliary hole plate 56 in an area at each conducting layer 11 that corresponds to the connector insertion area 2. The main hole plate 53 and the auxiliary hole plate 56 may be formed in one etching process, or may be formed respectively in two etching processes. Then, the conducting layers 11 and dielectric layers 12 having the main hole plate 53 and the auxiliary hole plate 56 are alternately laminated to form the printed circuit board 1 having the main hole plate 53 and the auxiliary hole plate 56.

Step 2: Drill the two auxiliary holes in the printed circuit board having the main hole plate and the auxiliary hole plate with a drill bit.

For example, drilling is performed with a drill bit of 12 mil. A specific method may be first drilling a hole with a diameter of 12 mil in the connector insertion area 2, and then keeping the drill bit rotated and moving the drill bit in a direction perpendicular to the first direction. The drill bit moves for a distance of, for example, 10 mil. In a process of moving the drill bit, a runway-shaped auxiliary hole 54 is formed, and then the other auxiliary hole 54 is formed in the connector insertion area 2. A spacing distance between the other auxiliary hole 54 and the formed auxiliary hole 54 may be 26 mil. Because structure shapes of the two auxiliary holes 54 are the same, details are not described again.

Step 3: Perform copper plating on an internal surface of the auxiliary hole, to form the second metal plating layer, where an annular through-hole is formed by the second metal plating layer in the auxiliary hole. Further, the second metal plating layer 55 may be formed on the internal surface of the auxiliary hole 54 through evaporation deposition, sputtering, electroplating, chemical plating, or vapor deposition, and the second metal plating layer 55 covers the internal surface of the auxiliary hole 54.

Step 4: Fill the annular through-hole formed by the second metal plating layer with resin or green oil.

Filling the annular through-hole formed by the first second plating layer 55 with resin or green oil can ensure that a surface of the printed circuit board keeps flat, and can also help subsequently form a main hole 51 and form a complete first metal plating layer 52 in the main hole 51.

Step 5: Perform drilling in the center of the two auxiliary holes to form the main hole. Further, the main hole 51 is formed by performing drilling at a symmetrical center of the two auxiliary holes 54, for example, by performing drilling with a drill bit of 16 mil. A center of the main hole 51 is the symmetrical center of the two auxiliary holes 54. Side walls on upper and lower sides of the main hole 51 are formed in the two auxiliary holes 54, in other words, the side walls of the upper and lower sides of the main hole 51 are respectively parts of side walls of the auxiliary holes 54 on the upper and lower sides of the main hole 51.

Step 6: Perform copper plating in the main hole 51 to form the first metal plating layer. Further, the first metal plating layer 52 may be formed on the internal surface of the main hole 51 through evaporation deposition, sputtering, electroplating, chemical plating, or vapor deposition, and the first metal plating layer 52 covers the internal surface of the main hole 51. In addition, a through-hole into which the ground crimping pin of the connector is inserted is formed by the first metal plating layer in the main hole 51.

It may be understood that, in the embodiment shown in FIG. 9, the drill bit may be replaced with a milling cutter, and the main hole 51 and the auxiliary holes 54 may be machined in the printed circuit board by using the milling cutter. In this case, side walls between the main hole 51 and the auxiliary holes 54 are connected. In addition, in the foregoing process of manufacturing the ground crimping hole 50, the second metal plating layer may not be formed in the auxiliary hole 54 first. Instead, electroplating may be performed in the main hole 51 and the auxiliary hole 54 to obtain the first metal plating layer and the second metal plating layer once after the auxiliary hole 54 and the main hole 51 are formed. The ground crimping hole 50 shown in FIG. 14 may be manufactured in this manner.

It should be noted that, when metal plating layers are formed in the main hole 51 and the auxiliary hole 54, or when metal plating layers are formed in the main part 61 and the auxiliary part 64, an optional metal plating manner is, when the main hole 51 and the auxiliary hole 54 or when the main part 61 and the auxiliary part 64 are blind holes that do not penetrate the printed circuit board, forming the metal plating layers in the blind holes, and another optional metal plating manner is, when the main hole 51 and the auxiliary hole 54 or when the main part 61 and the auxiliary part 64 are through-holes that penetrate the printed circuit board, forming the metal plating layers in the through-holes. Forming a metal plating layer in a through-hole generally includes covering the entire internal surface of the through-hole with the metal plating layer and covering the internal surface of the through-hole with the metal plating layer within a specified depth. When the internal surface of the through-hole is covered with the metal plating layer within the specified depth, the entire internal surface of the through-hole is generally covered with the metal plating layer, and then a redundant metal plating layer in the through-hole is removed through backdrilling. For example, the printed circuit board includes 15 conducting layers, and when the first to the eighth conducting layers need to be connected, a through-hole that penetrates the printed circuit board is usually drilled on the printed circuit board 1 first, and then metal plating layers are formed on an internal surface of the through-hole. The metal plating layers cover the first to the fifteenth conducting layers in the through-hole, but actually only need to cover the first to the eighth conducting layers in the through-hole, and the metal plating layers at the ninth to the fifteenth conducting layers are not connected by lines. This part of redundant metal plating layers will affect signal integrity and may cause resonance problems. In this case, the part of metal plating layers may be drilled off on the back of the printed circuit board 1, in other words, the part of metal plating layers may be removed through backdrilling.

Signal crosstalk between two adjacent pairs of signal crimping holes 40 generally includes NEXT and FEXT. The NEXT means that, after one pair of signal crimping holes 40 transmits a signal, the signal is received at a signal input end (near end) of the other pair of signal crimping holes 40. This is referred to as the NEXT. The FEXT means that, after one pair of signal crimping holes 40 transmits a signal, the signal is received at a signal output end (far end) of the other pair of signal crimping holes 40. This is referred to as the FEXT. A signal crosstalk reduction effect may be obtained below through simulation analysis by using the foregoing embodiment.

In a conventional design of the ground crimping hole 50, the ground crimping hole 50 between the two adjacent pairs of signal crimping holes 40 has only one main hole.

Figure 15:
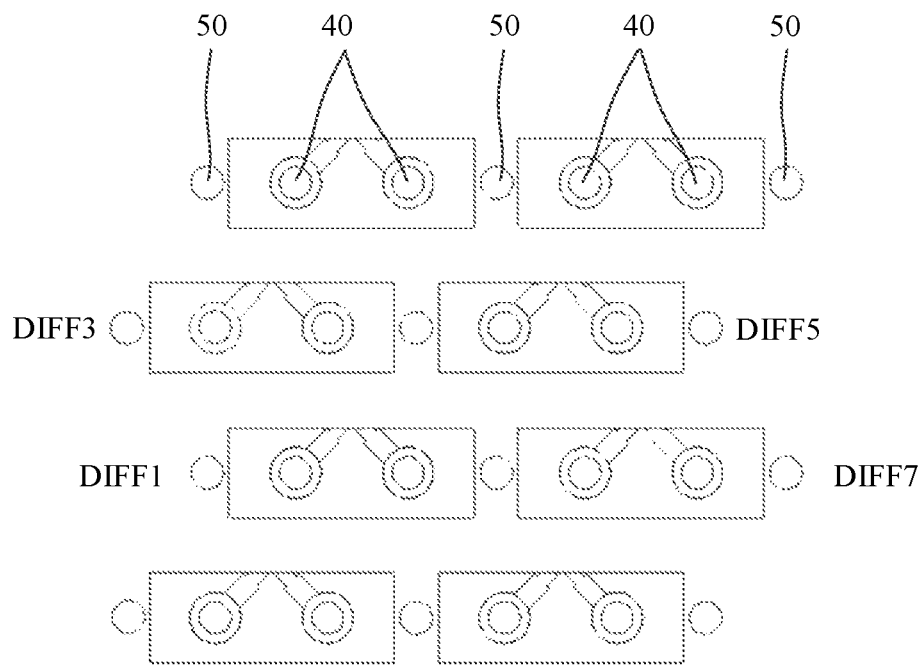
FIG. 15 is a schematic diagram of signal crosstalk in a related design.

When signals in one pair of signal crimping holes 40 are disturbed signals, signals in other three pairs of signal crimping holes 40 adjacent to the pair of signal crimping holes 40 are scrambled signals. For example, as shown in FIG. 15, the first pair of signal crimping holes from the left in the third row are disturbed signals and are represented by DIFF1, and for three pairs of signal crimping holes (including two pairs of signal crimping holes in the second row and the second pair of signal crimping holes from the left in the same row (the third row)) adjacent to the first pair of signal crimping holes, NEXT is represented by DIFF3, DIFF5, and DIFF7, and FEXT is represented by DIFF4, DIFF6, and DIFF8 respectively. DIFF3 and DIFF4, DIFF5 and DIFF6, and DIFF7 and DIFF8 are near ends and far ends of the three pairs of signal crimping holes 40 respectively. FIG. 15 shows only near ends DIFF3, DIFF5, and DIFF7 due to a limited viewing angle, and does not show far ends DIFF4, DIFF6, and DIFF8 (on the other side of the printed circuit board, and obscured by the printed circuit board).

Figure 16:
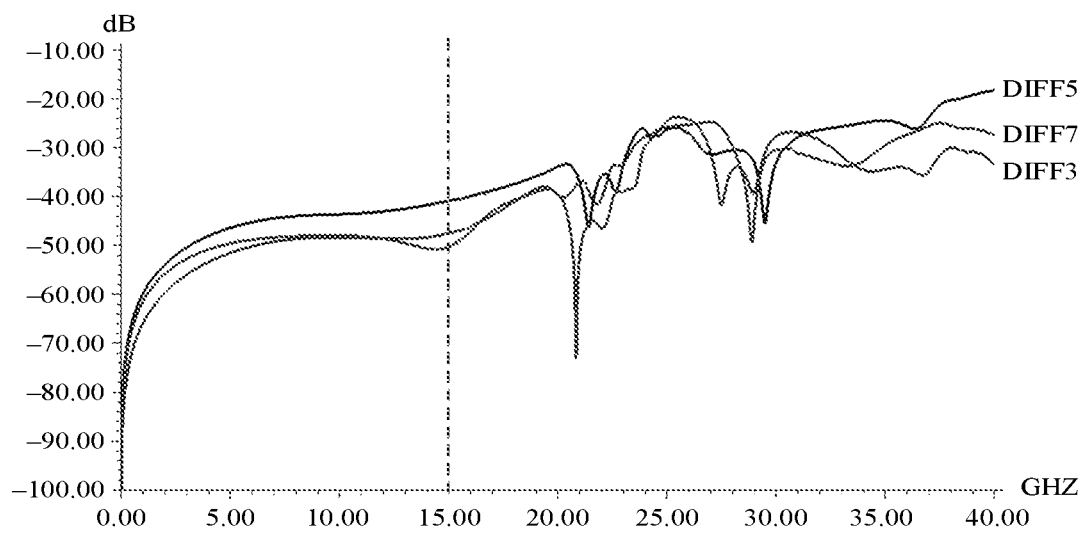
FIG. 16 is a schematic diagram of near-end crosstalk (NEXT) obtained through simulation in FIG. 15.
Figure 17:
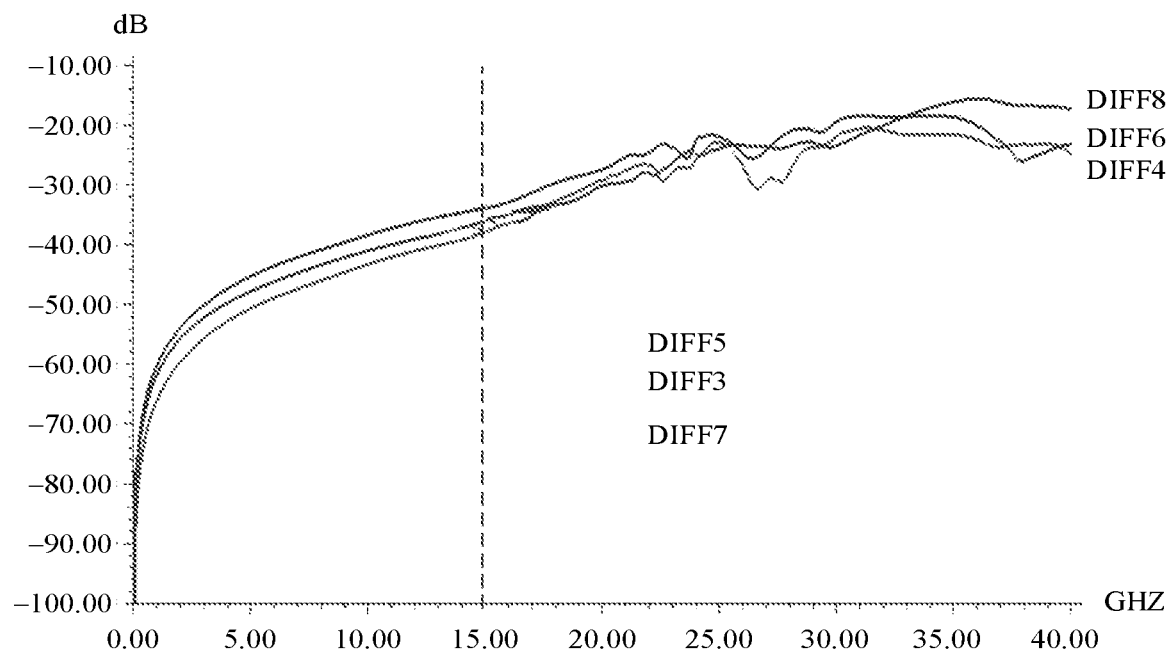
FIG. 17 is a schematic diagram of far-end crosstalk (FEXT) obtained through simulation in FIG. 15.

By performing signal crosstalk simulation analysis on the structure shown in FIG. 15, NEXT simulation curves of DIFF3, DIFF5, and DIFF7 may be separately obtained, as shown in FIG. 16, and FEXT simulation curves of DIFF4, DIFF6, and DIFF8 may be separately obtained, as shown in FIG. 17. According to the NEXT simulation curves shown in FIG. 16, it may be learned that NEXT signal strengths are respectively −40.8 decibel (dB)/−47.5 dB/−50.3 dB/@15 gigahertz (GHz). According to the FEXT simulation curves shown in FIG. 17, it may be learned that FEXT signal strengths are respectively −33.9 dB/−37.8 dB/−36.0 dB/@15 GHz. For details, refer to Table 1.

Figure 18:
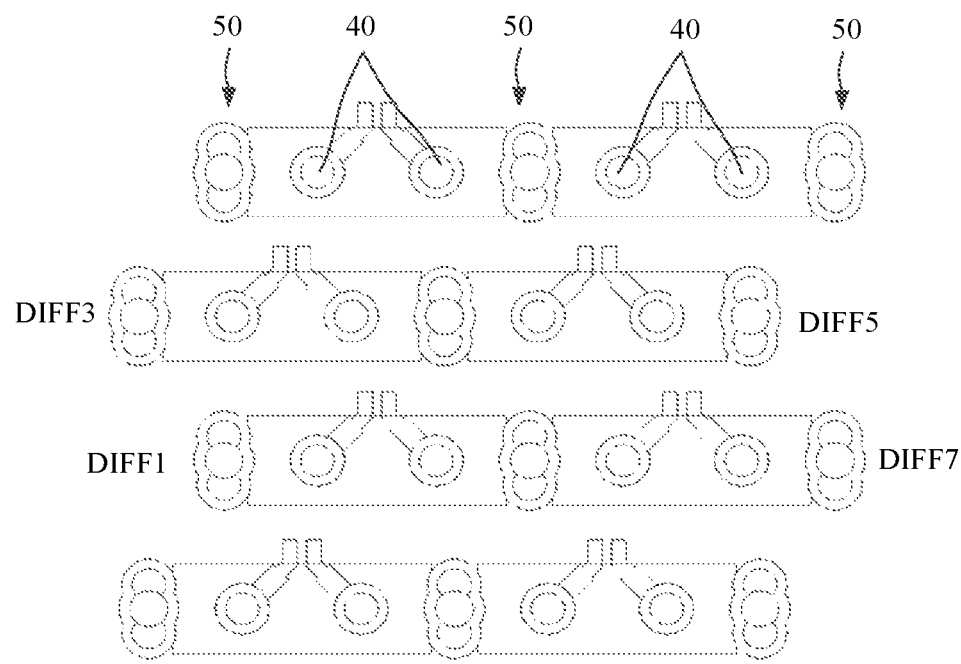
FIG. 18 is a schematic diagram of signal crosstalk in the embodiment shown in FIG. 7.
Figure 19:
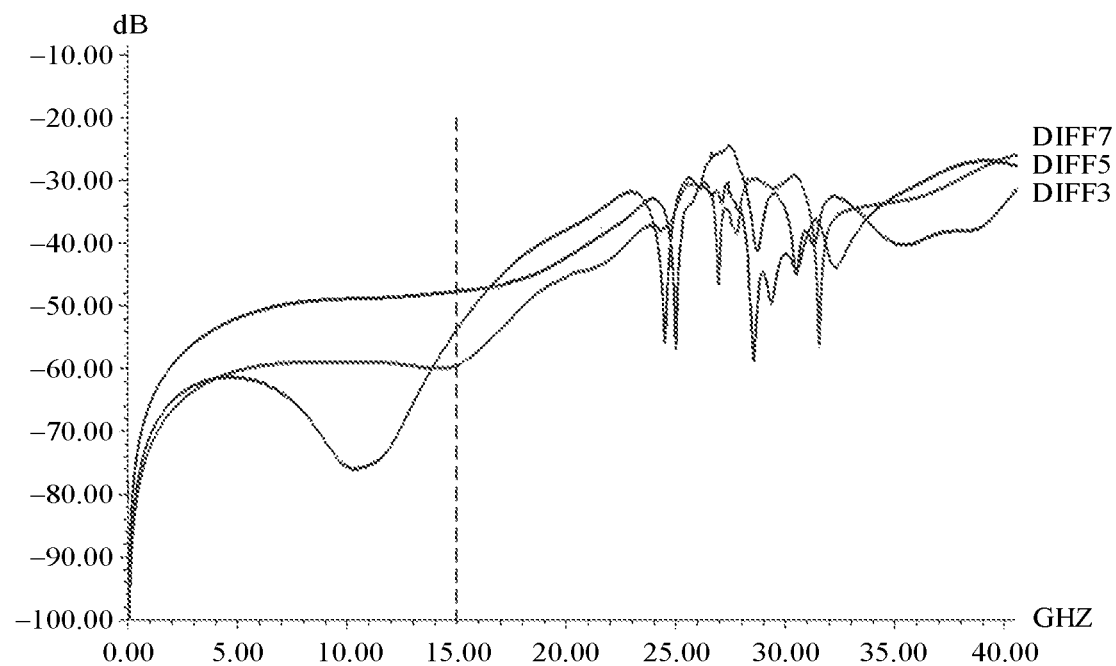
FIG. 19 is a schematic diagram of NEXT obtained through simulation in FIG. 18.
Figure 20:
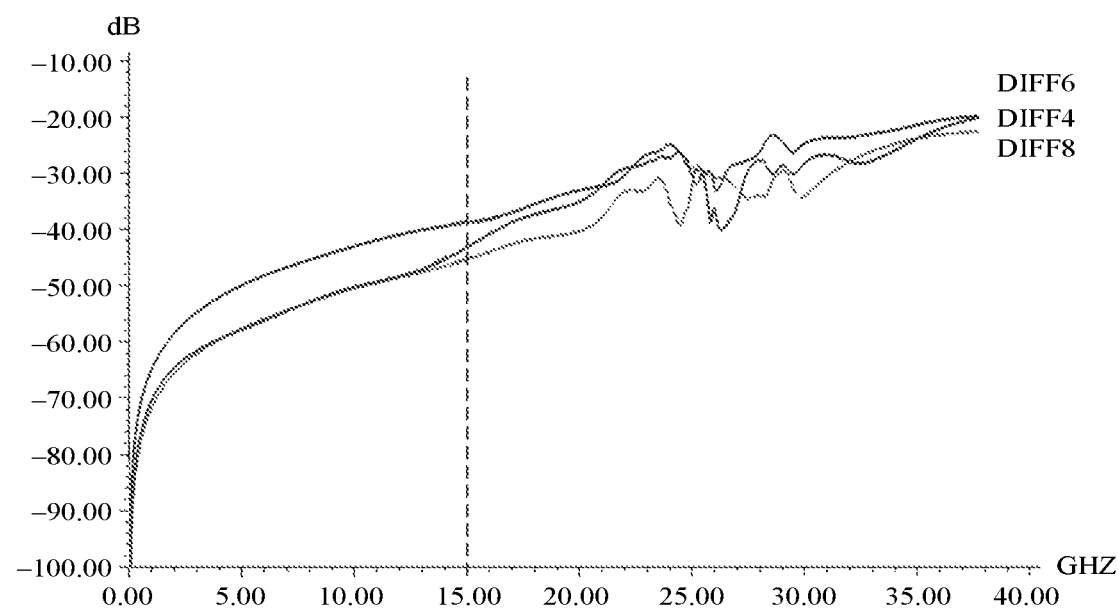
FIG. 20 is a schematic diagram of FEXT obtained through simulation in FIG. 18.

When the design solution for the ground crimping hole 50 shown in FIG. 7 is used, as shown in FIG. 18, similarly, the first pair of signal crimping holes from the left in the third row are disturbed signals and are represented by DIFF1, and for three pairs of signal crimping holes (including two pairs of signal crimping holes in the second row and the second pair of signal crimping holes from the left in the same row (the third row)) adjacent to the first pair of signal crimping holes, NEXT is represented by DIFF3, DIFF5, and DIFF7, and FEXT is represented by DIFF4, DIFF6, and DIFF8 respectively. By performing signal crosstalk simulation analysis on the structure shown in FIG. 18, NEXT simulation curves of DIFF3, DIFF5, and DIFF7 may be separately obtained, as shown in FIG. 19, and FEXT simulation curves of DIFF4, DIFF6, and DIFF8 may be separately obtained, as shown in FIG. 20. According to the NEXT simulation curves shown in FIG. 19, it may be learned that NEXT signal strengths are respectively −48.2 dB/−53.3 dB/−59.6 dB/@15 GHz. According to the FEXT simulation curves shown in FIG. 20, it may be learned that FEXT signal strengths are respectively −40.2 dB/−45.9 dB/−47.2 dB/@15 GHz. For details, refer to Table 1.

It can be learned from Table 1 that, compared with a conventional solution of designing a ground crimping hole, the solution of designing a ground crimping hole shown in FIG. 7 can reduce NEXT by about 6 to 9 dB/@15 GHz, and can reduce FEXT by about 6 to 11 dB/@15 GHz. In other words, compared with the conventional solution of designing a ground crimping hole, the solution of designing a ground crimping hole shown in FIG. 7 significantly reduces signal crosstalk between two adjacent pairs of signal crimping holes 40.

TABLE 1

| | Item | | | | | |
|---|---|---|---|---|---|---|
| | NEXT | | | FEXT | | |
| Solution | DIFF3 | DIFF5 | DIFF7 | DIFF3 | DIFF5 | DIFF7 |
| Regular solution | −40.8 dB | −47.5 dB | −50.3 dB | −33.9 dB | −37.8 dB | −36.0 dB |
| Solution in embodiments of this application | −48.2 dB | −53.3 dB | −59.6 dB | −40.2 dB | −45.9 dB | −47.2 dB |
| Comparison result | 8.6 dB | 5.8 dB | 9.3 dB | 6.3 dB | 8.1 dB | 11.2 dB |

Figure 21:
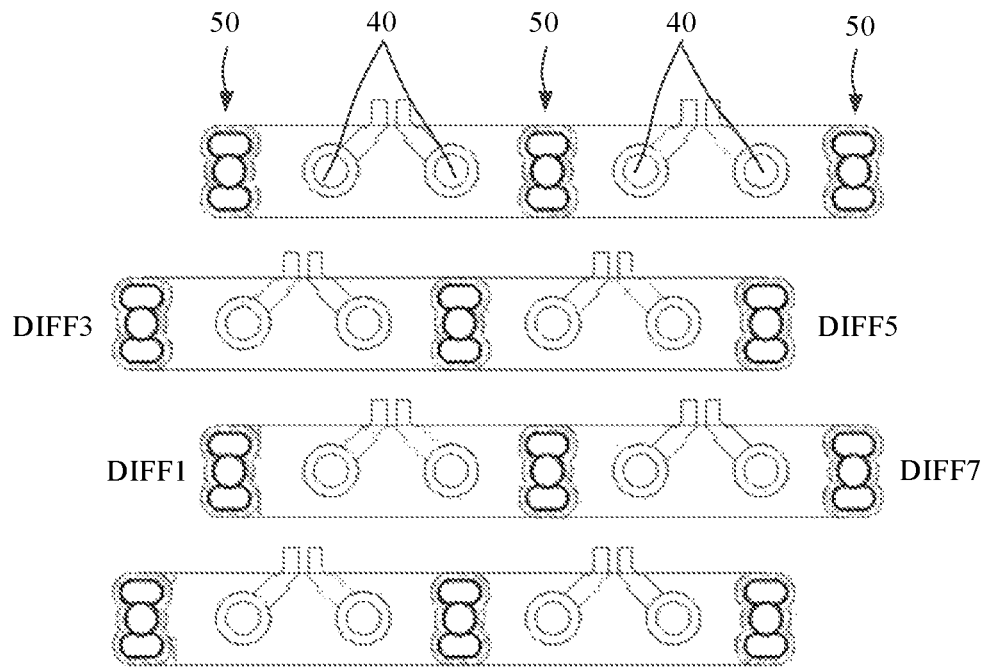
FIG. 21 is a schematic diagram of signal crosstalk in the embodiment shown in FIG. 9.
Figure 22:
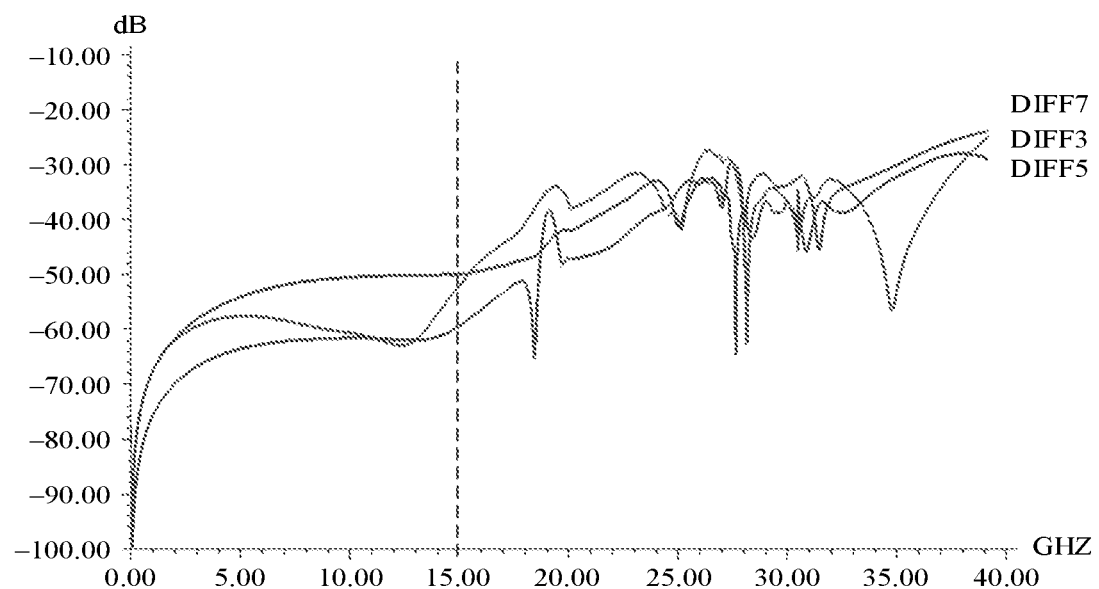
FIG. 22 is a schematic diagram of NEXT obtained through simulation in FIG. 21.
Figure 23:
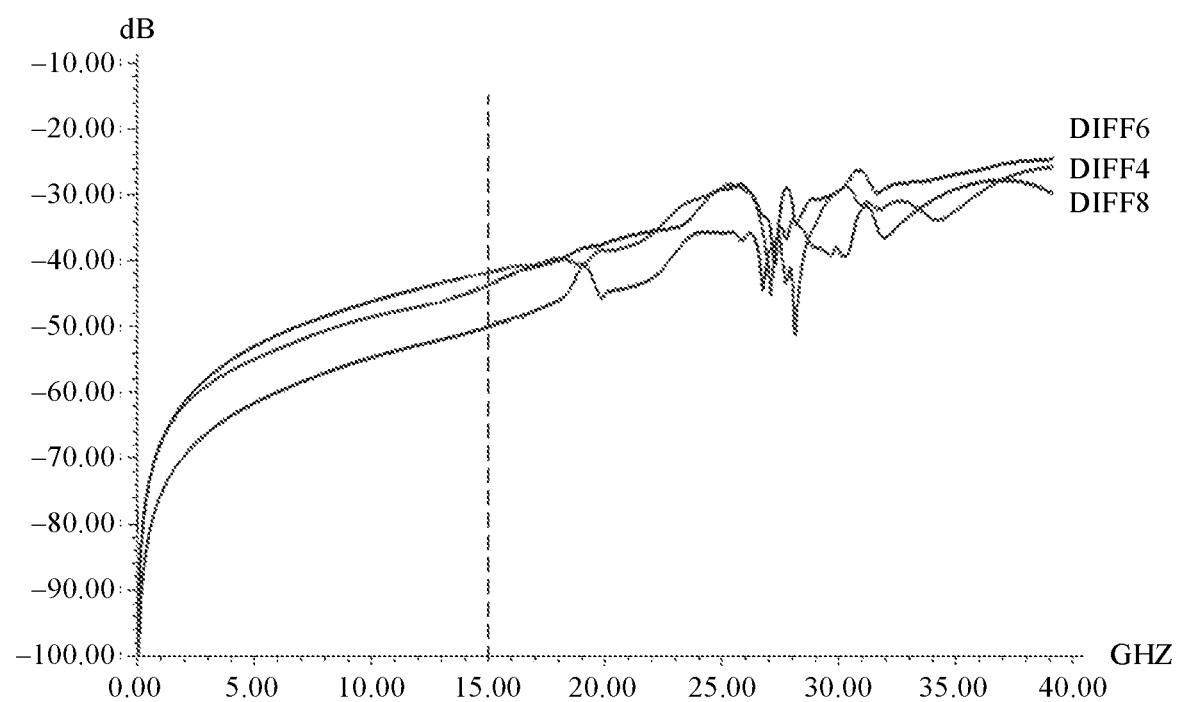
FIG. 23 is a schematic diagram of FEXT obtained through simulation in FIG. 21.

When the design solution for the ground crimping hole 50 shown in FIG. 9 is used, as shown in FIG. 21, similarly, the first pair of signal crimping holes from the left in the third row are disturbed signals and are represented by DIFF1, and for three pairs of signal crimping holes (including two pairs of signal crimping holes in the second row and the second pair of signal crimping holes from the left in the same row (the third row)) adjacent to the first pair of signal crimping holes, NEXT is represented by DIFF3, DIFF5, and DIFF7, and FEXT is represented by DIFF4, DIFF6, and DIFF8 respectively. By performing signal crosstalk simulation analysis on the structure shown in FIG. 21, NEXT simulation curves of DIFF3, DIFF5, and DIFF7 may be separately obtained, as shown in FIG. 22, and FEXT simulation curves of DIFF4, DIFF6, and DIFF8 may be separately obtained, as shown in FIG. 23. According to the NEXT simulation curves shown in FIG. 22, it may be learned that NEXT signal strengths are respectively −50.1 dB/−53.7 dB/−60.3 dB/@15 GHz. For details, refer to Table 2. According to the FEXT simulation curves shown in FIG. 23, it may be learned that FEXT signal strengths are respectively −42.6 dB/−44.3 dB/−50.5 dB/@15 GHz. For details, refer to Table 2.

It can be learned from Table 2 that, compared with a conventional solution of designing a ground crimping hole, the solution of designing a ground crimping hole shown in FIG. 9 can reduce NEXT by about 6 to 10 dB/@15 GHz, and can reduce FEXT by about 6.5 to 14.5 dB/@15 GHz. In other words, compared with the conventional solution of designing a ground crimping hole, the solution of designing a ground crimping hole shown in FIG. 9 significantly reduces signal crosstalk between two adjacent pairs of signal crimping holes 40.

TABLE 2

| | Item | | | | | |
|---|---|---|---|---|---|---|
| | NEXT | | | FEXT | | |
| Solution | DIFF3 | DIFF5 | DIFF7 | DIFF3 | DIFF5 | DIFF7 |
| Regular solution | −40.8 dB | −47.5 dB | −50.3 dB | −33.9 dB | −37.8 dB | −36.0 dB |
| Solution in embodiments of this application | −50.1 dB | −53.7 dB | −60.3 dB | −42.6 dB | −44.3 dB | −50.5 dB |
| Comparison result | 9.3 dB | 6.2 dB | 10.0 dB | 8.7 dB | 6.5 dB | 14.5 dB |

To further reduce the signal crosstalk between the two adjacent pairs of signal crimping holes 40, on a basis of Embodiment 1 and Embodiment 2, as shown in FIG. 6 or FIG. 11, in two adjacent rows of crimping holes, in the first direction, any pair of signal crimping holes 40 in a current row and any pair of signal crimping holes 40 in a next row are staggered, and a ground crimping hole 50 in the current row and a ground crimping hole 50 in the next row are staggered. Staggering any pair of signal crimping holes 50 in the two adjacent upper and lower rows can increase a distance between two adjacent upper and lower pairs of signal crimping holes 40 in the two adjacent upper and lower rows, and therefore can reduce signal crosstalk between the two adjacent upper and lower pairs of signal crimping holes 40 in the two adjacent upper and lower rows.

An embodiment of this application further provides a communications device, including the printed circuit board provided in the foregoing embodiments and a connector that fits with the printed circuit board. A signal crimping pin in the connector is inserted into a signal crimping hole of the printed circuit board, and a ground crimping pin in the connector is inserted into a ground crimping hole. Because the communications device uses the printed circuit board described in the foregoing embodiments, the communications device has advantages of the foregoing printed circuit board. For details, refer to the foregoing related descriptions. Details are not described herein again.

In the descriptions of this specification, reference to descriptions of terms "one implementation", "some implementations", "example implementations", "example", "specific example", "some examples", or the like means specific features, structures, materials, or features described with reference to the implementations or examples are included in at least one implementation or example of this application. In this specification, the foregoing example expressions of the terms are not necessarily a same embodiment or example. In addition, the described specific features, structures, materials, or features may be combined in a proper manner in any one or more of the implementations or examples.

Finally, it should be noted that the foregoing embodiments are merely intended for describing the technical solutions of this application other than limiting this application. Although this application is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of embodiments of this application.

What is claimed is:

1. A printed circuit board comprising:
   a connector insertion area comprising:
      a plurality of rows of crimping holes, wherein each of the rows of crimping holes comprises at least two pairs of signal crimping holes arranged at intervals, and wherein each of the at least two pairs of signal crimping holes comprises two signal crimping holes; and
      at least one ground crimping hole arranged on either side of each of the at least two pairs of signal crimping holes and in a row arrangement direction of the two signal crimping holes, wherein a first depth of the at least one ground crimping hole is greater than or equal to a second depth of the two signal crimping holes, and wherein the at least one ground crimping hole comprises:
         a main hole comprising a first side wall comprising a first part, wherein the main hole is of a first length; and
         a shielding component on at least one side of the main hole and comprising:

a second side wall comprising a second part, wherein the shielding component is of a second length, wherein the first part is the second part, wherein a sum of the first length and the second length in a first direction is greater than a third length of the two signal crimping holes in the first direction, and wherein the first direction is in a same plane as the row arrangement direction and is perpendicular to the row arrangement direction; and an auxiliary hole comprising a third side wall, wherein the third side wall forms a first portion of the auxiliary hole and a second portion of the main hole, and wherein the third side wall separates the auxiliary hole and the main hole.

2. The printed circuit board of claim 1, wherein the main hole further comprises a first internal surface, and wherein the printed circuit board further comprises a first metal plating layer disposed on the first internal surface.

3. The printed circuit board of claim 2, wherein the third side wall comprises a third part, wherein the first part is the third part, and wherein the shielding component further comprises a second metal plating layer disposed on a second internal surface of a fourth part of the third side wall other than the third part.

4. The printed circuit board of claim 3, wherein the auxiliary hole is filled with resin or green oil.

5. The printed circuit board of claim 3, wherein the auxiliary hole is a crescent-shaped hole, a circular hole, an elliptical hole, a strip-shaped hole, or a runway-shaped hole.

6. The printed circuit board of claim 2, wherein the first metal plating layer is made of copper foil.

7. The printed circuit board of claim 2, wherein the first metal plating layer is formed through electroplating, evaporation deposition, sputtering, chemical plating, or vapor deposition.

8. The printed circuit board of claim 1, wherein the shielding component further comprises:
a plurality of first metal layers, wherein each of the first metal layers is a first area of each conducting layer that is located in the connector insertion area; and
a plurality of second metal layers alternately stacked with the first metal layers, wherein each of the second metal layers is formed by a second area of a dielectric layer in the connector insertion area through a displacement reaction, and wherein the first area corresponds to the second area in a thickness direction of the printed circuit board.

9. The printed circuit board of claim 1, further comprising at least one dielectric layer made of resin or glass fiber.

10. The printed circuit board of claim 1, wherein the at least one ground crimping hole comprises two shielding components, and wherein the two shielding components are on two sides of the main hole in the first direction.

11. The printed circuit board of claim 1, wherein the at least one ground crimping hole comprises at least three shielding components arranged at equal intervals around the main hole.

12. The printed circuit board of claim 1, wherein the connector insertion area further comprises:
a main hole plate disposed on a first periphery of the main hole; and
an auxiliary hole plate disposed on a second periphery of the shielding component.

13. The printed circuit board of claim 1, wherein in two adjacent rows of crimping holes, in the first direction, a first pair of signal crimping holes in a current row and a second pair of signal crimping holes in a next row are staggered, and wherein a first ground crimping hole in the current row and a second ground crimping hole in the next row are staggered.

14. The printed circuit board of claim 1, wherein the main hole is a circular hole, an elliptical hole, or an oblate hole.

15. The printed circuit board of claim 1, wherein the shielding component further comprises a second auxiliary hole comprising a fourth side wall, wherein the fourth side wall forms a third portion of the second auxiliary hole and a fourth portion of the main hole, wherein the fourth side wall separates the second auxiliary hole and the main hole, and wherein the auxiliary hole and the second auxiliary hole are on opposite sides of the main hole.

16. The printed circuit board of claim 1, wherein the at least one ground crimping hole comprises a plurality of ground crimping holes, and wherein each of the at least two pairs of signal crimping holes is between two of the plurality of ground crimping holes.

17. A printed circuit board comprising:
a connector insertion area comprising:
a plurality of rows of crimping holes, wherein each of the rows of crimping holes comprises at least two pairs of signal crimping holes arranged at intervals, and wherein each of the at least two pairs of signal crimping holes comprises two signal crimping holes; and
at least one ground crimping hole arranged on either side of each of the at least two pairs of signal crimping holes and in a row arrangement direction of the two signal crimping holes, wherein a first depth of the at least one ground crimping hole is greater than or equal to a second depth of the two signal crimping holes, and wherein the at least one ground crimping hole comprises:
a main part of a first length; and
an auxiliary part coupled to the main part and comprising:
a first internal surface, wherein the auxiliary part is of a second length and comprises a first metal plating layer disposed on the first internal surface, wherein a sum of the first length and the second length in a first direction is greater than a third length of the two signal crimping holes in the first direction, and wherein the first direction is in a same plane as the row arrangement direction and is perpendicular to the row arrangement direction; and
an auxiliary hole comprising a third side wall, wherein the third side wall forms a first portion of the auxiliary hole and a second portion of the main part, and wherein the third side wall separates the auxiliary hole and the main part.

18. The printed circuit board of claim 17, wherein the main part further comprises a second internal surface, and wherein the second internal surface comprises a second metal plating layer disposed on the second internal surface and coupled to the first metal plating layer.

19. The printed circuit board of claim 17, wherein a first cross section of the at least one ground crimping hole is peanut-shaped or dumbbell-shaped by using a surface parallel to the printed circuit board as a second cross section.

20. The printed circuit board of claim 17, wherein the at least one ground crimping hole comprises a hole plate disposed on a periphery of the at least one ground crimping hole.

21. A method comprising:
forming a main hole plate and an auxiliary hole plate in a connector insertion area in a printed circuit board (PCB);
forming two auxiliary holes in the PCB;
forming a second metal plating layer on an internal surface of each of the two auxiliary holes;
forming an annular through-hole by the second metal plating layer;
filling the annular through-hole with a dielectric;
forming a main hole in a center of the two auxiliary holes, wherein the main hole comprises a first side wall and a second side wall, wherein the first side wall forms a first portion of the main hole and a second portion of a first one of the two auxiliary holes, wherein the first side wall separates the main hole and the first one of the two auxiliary holes, wherein the second side wall forms a third portion of the main hole and a fourth portion of a second one of the two auxiliary holes, and wherein the second side wall separates the main hole and the second one of the two auxiliary holes; and
forming a first metal plating layer in the main hole.

22. The method of claim 21, further comprising etching conducting layers in the connector insertion area to form the main hole plate and the auxiliary hole plate.

* * * * *